(12) United States Patent
Raichle

(10) Patent No.: US 6,895,809 B2
(45) Date of Patent: May 24, 2005

(54) METHOD AND APPARATUS FOR TESTING A MOTOR

(75) Inventor: Kurt Raichle, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 0 days.

(21) Appl. No.: 10/331,614

(22) Filed: Dec. 31, 2002

(65) Prior Publication Data

US 2004/0124870 A1 Jul. 1, 2004

(51) Int. Cl.$^7$ .................................. G01M 15/00
(52) U.S. Cl. ..................................... 73/119 R
(58) Field of Search ........................ 73/119 R, 116; 324/772; 363/98; 318/254, 687, 727, 805, 802; 702/84, 183; 364/565

(56) References Cited

U.S. PATENT DOCUMENTS

| | | | | |
|---|---|---|---|---|
| 4,744,041 A | * | 5/1988 | Strunk et al. ................. 702/84 |
| 4,785,224 A | * | 11/1988 | Pfalzgraf et al. ............ 318/663 |
| 4,922,172 A | * | 5/1990 | Roddy et al. ................ 318/490 |
| 5,621,293 A | * | 4/1997 | Gennesseaux .............. 318/687 |
| 5,811,668 A | * | 9/1998 | Kondoh et al. ................ 73/116 |
| 6,301,137 B1 | * | 10/2001 | Li ................................. 363/98 |
| 6,489,742 B2 | * | 12/2002 | Lumsden ..................... 318/727 |

* cited by examiner

Primary Examiner—Eric S. McCall
Assistant Examiner—Octavia Davis
(74) Attorney, Agent, or Firm—Baker & Hostetler LLP; Marc W. Butler

(57) ABSTRACT

A method and apparatus for testing an electric motor is provided. A voltage generator is configured to pulse a voltage into a motor. The current associated with the motor is measured and compared to the voltage pulses to determine a phase angle. The operability of the motor is determined based on the phase angle.

19 Claims, 4 Drawing Sheets

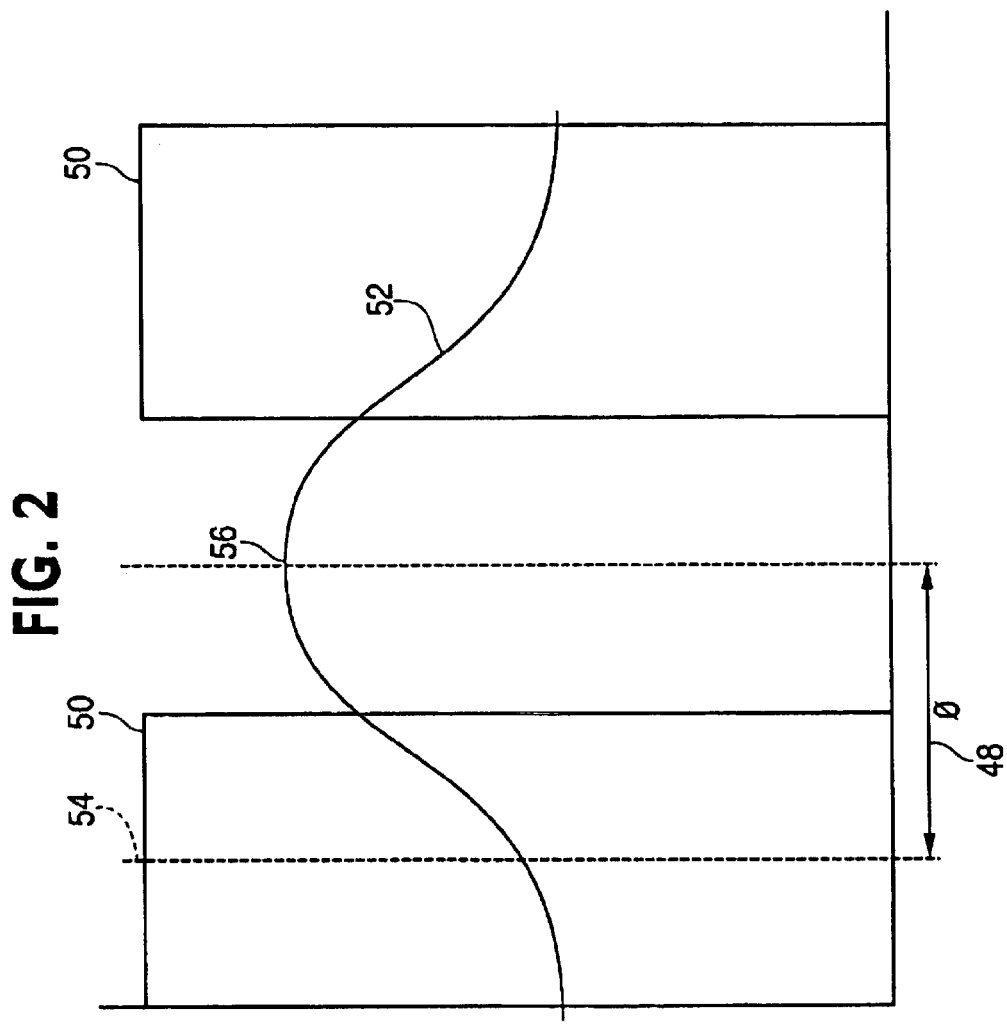

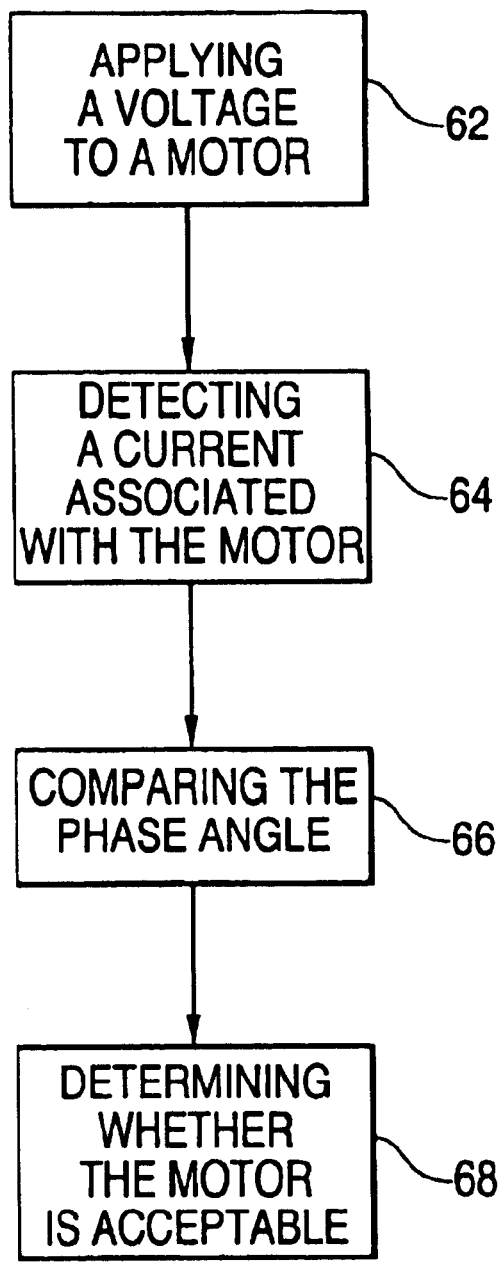

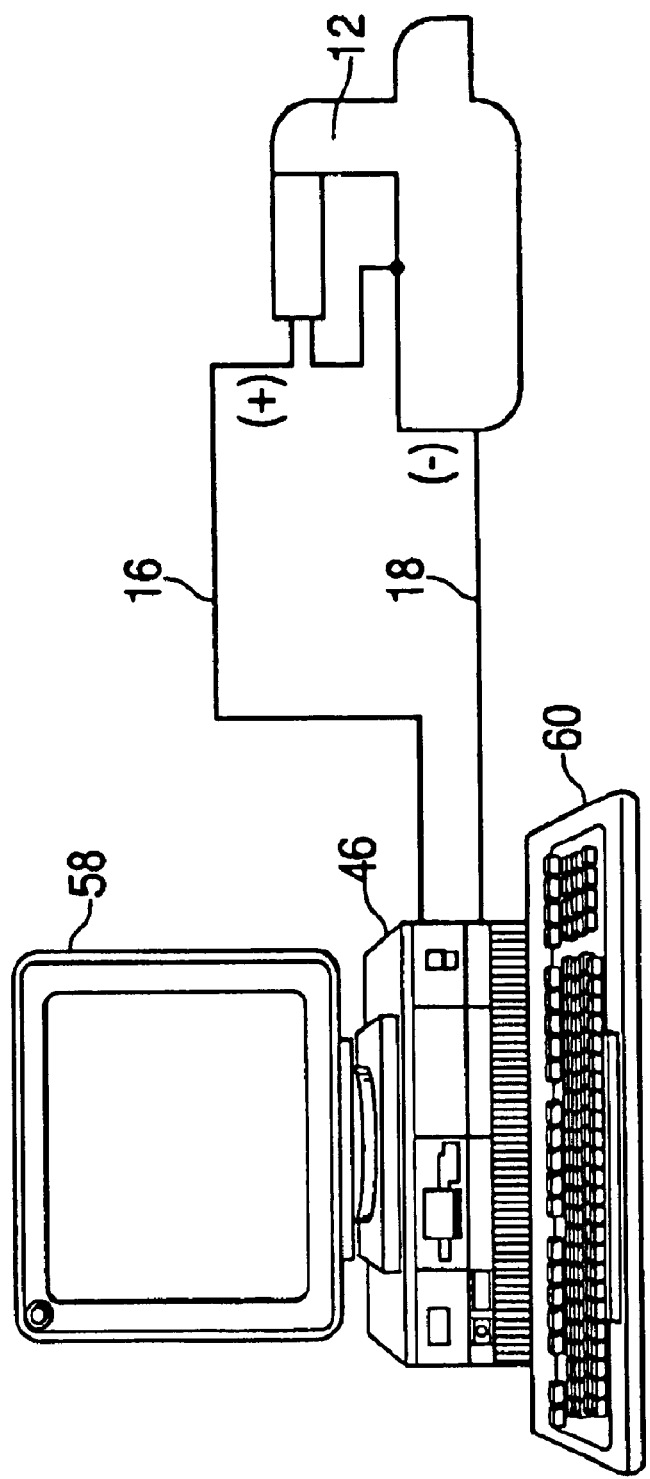

METHOD AND APPARATUS FOR TESTING A MOTOR

FIELD OF THE INVENTION

The present invention relates generally to a method and apparatus for testing an electric motor. More particularly, the present invention relates to a method and apparatus for testing a motor such as, for example, starter motor for an internal combustion engine.

BACKGROUND OF THE INVENTION

Electric motors, like any other machine or device, are subject to wear, malfunction, and breakage. Some electric motors, such as starter motors, are typically powered by a battery to start an internal combustion engine such as a car engine. When a starter motor does not operate properly it may be difficult or impossible to start a car. Thus, a starter motor can have an important impact on the reliability of an automobile. Accordingly, it is desirable to test starter motors from time to time to ensure their proper function, so that problems can be detected and corrected before a starter motor is working so poorly as to not be able to start the internal combustion engine of an automobile.

A large variety of conditions can cause a starter motor to not work properly. For example, there may be a short in the winding. The motor may be operating with a shorted winding due to a breakage or some other fault. Other causes for a malfunctioning motor may include a worn bearing within the motor. These, and other conditions, may cause a starter motor to not operate properly when subjected to a starter current. When a starter motor is not working properly, the motor may simply not operate at all or may operate at reduced revolutions per minute (RPM). If the starter motor is unable to apply the proper RPM to the internal combustion engine, the internal combustion engine may not start, thus, reducing the reliability of the automobile.

Currently, some ways of testing starter motors include applying a voltage to a starter motor and measuring the amount of current associated with the starter motor. If a current level is too high a tester may suspect that there is a short within the motor. Other test methods include observing the RPMs generated by the starter motor. Observing the RPMs generated by a starter motor may include a technician listening to the motor and determining whether the start motor "sounds" right. However, this type of testing may be relatively imprecise and may lead to deeming a malfunctioning starter motor as acceptable. Some problems may go undetected within the starter motor using starter motor test methods presently used. Accordingly, it is desirable to provide a convenient and effective method and apparatus for testing starter motors and determining their operability.

SUMMARY OF THE INVENTION

It is therefore a feature and advantage of the present invention to provide a method and apparatus for testing electric motors, in particular, starter motors. The above and other features and advantages are achieved through the use of a novel method and apparatus as herein disclosed. In accordance with one embodiment of the present invention an apparatus for testing electric motors is provided. The apparatus includes a voltage generator operatively connected to the motor to pulse a voltage into the motor, a current sensor configured to sense a current associated with the motor; and a detector configured to detect a phase angle between the voltage applied to the motor and current associated with the motor.

In accordance with another embodiment of the present invention an apparatus for testing electric motors is provided. The apparatus includes means for generating a voltage operatively connected to the motor to pulse a voltage into the motor, means for sensing a current configured to sense a current associated with the motor, and means for detecting configured to detect a phase angle between the voltage applied to the motor and current associated with the motor.

In accordance with another embodiment of the present invention a method for testing an electric motor is provided. The method includes the steps of applying a voltage pulse to the motor, detecting a current associated with the motor, and comparing a phase angle between the voltage and the current.

There has thus been outlined, rather broadly, the some of the features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 2 provides a plot of a pulsed voltage applied to a starter motor and a current associated with the starter motor. A phase angle showing the difference in phase between the volts and current are also shown.

FIG. 3 is a flowchart of a method of testing an electric motor according to an embodiment of the invention.

FIG. 4 is a schematic diagram of an embodiment of the invention where the starter tester functions are performed by a computer.

DETAILED DESCRIPTION OF PREFERRED EMBODIMENTS OF THE INVENTION

Figure 1:
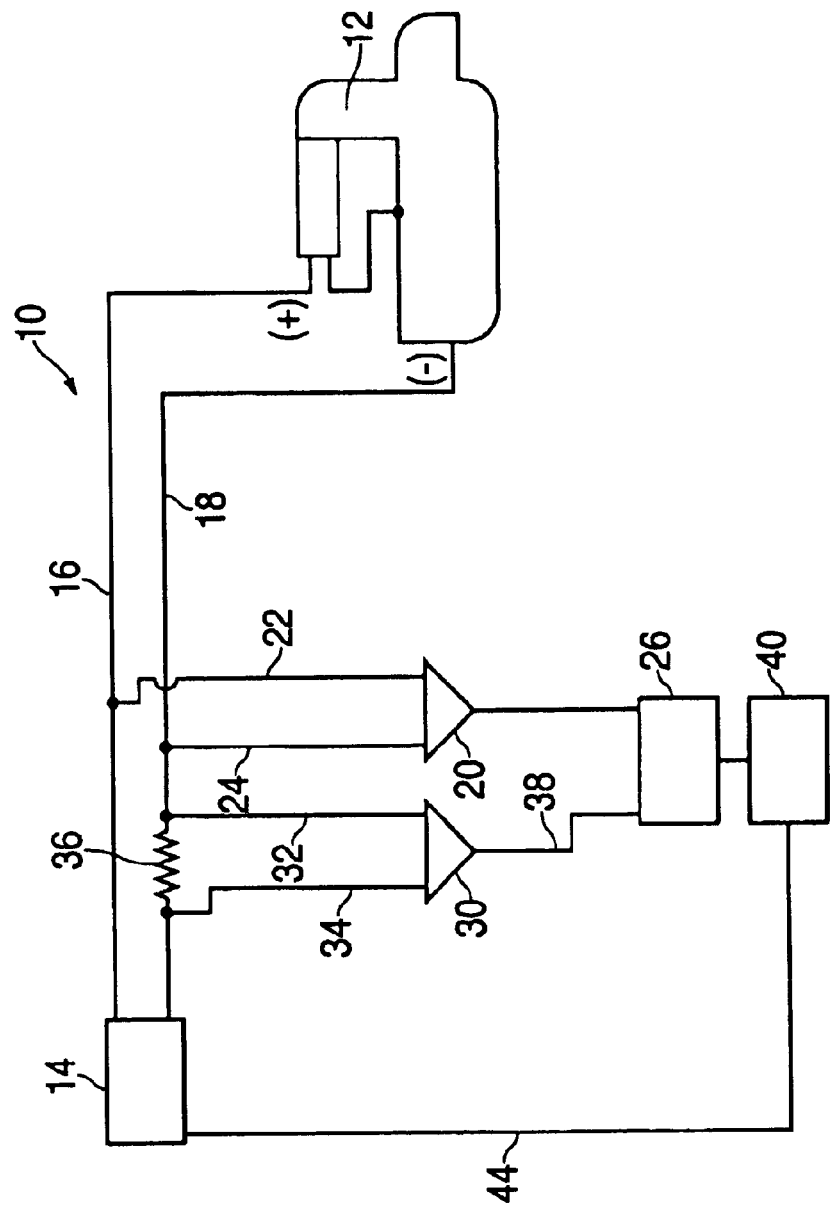
FIG. 1 is a schematic diagram of a system for testing an electric starter motor according to a preferred embodiment of the present invention.

Turning now to the figures where like elements are noted by like reference numerals, FIG. 1 is a schematic diagram of an apparatus 10 for testing a starter motor 12. The apparatus 10 includes a DC current supply 14 capable of sending DC current in a pulse. The DC current supply 14 is connected to the starter motor 12 by a positive connector 16 and negative connector 18.

According to some embodiments of the invention, the voltage across the starter motor 12 is monitored by a group of components that will now be described. A differential amplifier 20 is connected by a connector 22 to the positive connector 16. The differential amplifier 20 is connected by a connector 24 to the negative connector 18. The differential amplifier 20 sends a signal corresponding to the detected voltage to a converter 26. Preferably, the converter 26 is an analog to digital converter. The differential amplifier 20 is connected to the converter 26 by connector 28.

While the preferred embodiment of the invention is described as using a DC supply with a DC motor, an AC supply used to test an AC motor is within the scope of the invention. When an AC motor is tested and an AC pulse supply is used, the starter tester 10 may be modified for use with AC current. One skilled in the art will understand what modifications will need to be made for using AC current in the disclosed system when presented with the information contained in this disclosure.

According to some embodiments of the current invention, the current associated with the starter motor 12 is detected by the components now described. A differential amplifier 30 is connected to the negative connector 18 by a connector 32. A connector 34 connects the differential amplifier 22 to the negative connection 18. Connectors 34 and 34 are both connected to the negative connector 18 but on different parts of the negative connector 18 separated by a resister 36. This configuration will permit the differential amplifier 30 to receive a signal corresponding to the current associated with the starter motor 12.

The differential amplifier 30 sends a signal to a converter 26 corresponding to the current associated with the starter motor 12 via a connector 38. The converter 26 processes the signals received from the voltage differential amplifier 20 and the current differential amplifier 30 and sends a signal to a processor 40 corresponding to the voltage and current via a connector 42. In preferred embodiments of the invention, the processor 40 will define a phase angle between the voltage and current. In preferred embodiments of the present invention, processor 40 is a digital signal processor or (DSP). The processor 40 may be connected to the DC supply 14 by connector 44. This connector 44 permits the processor 40 to send a control signal to the DC supply 14, and control the operation of the DC supply 14.

According to some embodiments of the invention, the control signal sent from the processor 40 to the pulse DC supply 14 controls the DC supply 14 to apply voltage to the starter motor 12 at certain intervals.

According to some embodiments of the invention, the pulse DC supply 14 may send multiple pulses of voltage to the motor 12 so that the motor 12 may be tested when the rotor within the motor 12 is in a variety of initial conditions, thus permitting a more thorough test of the starter motor 12.

According to some embodiments of the invention, some or all of the components (e.g., the pulse DC supply 14, voltage differential amplifier 20 current differential amplifier 30, resistor 36, converter 26, processor 40) may be incorporated into, or their functions performed by, computer software or hardware. In other words, some embodiments of the invention may include software or hardware performing all or some of the functions of the starter tester 10 rather than the individual components described herein. Embodiments of the invention using software or hardware performing the starter tester functions may include a computer 46 connected to a starter motor as shown in FIG. 4. The computer 46 may have hardware or software configured to test the starter motor as previously described.

In some embodiments of the present invention the processor 40 controls the DC supply 14 to send pulses of voltage to the starter motor 12. The pulses of voltage may occur in on/off increments. The voltage is pulsed to the starter motor 12. As a result of exposure to the voltage pulses, current will flow through the starter motor 12. Due to impedance and other resistances associated with the connectors 16, 18 and starter motor 12, current will flow through the starter motor 12 lagging behind the pulses of voltage. The current lag with respect to the voltage is referred to as a phase angle 48.

FIG. 2 is a plot showing representative waveforms exemplifying voltage pulses by waveform 50. Waveform 52 is a plot exemplifying a current associated with the starter motor 12. The differences in peaks 54, 56 associated with the pulsed volt wave 50 and the current wave 52 represent a phase angle 48 between the peaks of 54, 56 the representative waveforms 50 and 52. Impedance in the starter motor 12 and the connectors 16 and 18 will cause the current to be out of phase with the pulsed voltage, even when the starter motor 12 is operating properly.

Certain conditions within the starter motor 12 can effect the phase angle 48 between the current in the starter motor 12. For example, if the winding in the starter motor 12 contains a short, the phase angle 48 will be smaller than in a properly operating starter motor 12 because of the reduced impedance associated with a short in the windings. If a bearing within the starter motor 12 is not operating properly and causing increased resistance within the starter motor 12, the phase angle 48 may be outside an acceptable range because the increased resistance within the starter motor 12. Other conditions within the starter motor 12 can result in the phase angle 48 being longer or shorter than expected. As a result of the conditions occurring within the starter motor effecting the phase angle 48, the phase angle 48 may be used as a diagnostic tool in determining whether a starter motor 12 is operating properly.

Different models and configurations of starter motors 12 will have different impedances, so a phase angle 48 between the voltage and current applied to a starter motor 12 will vary from motor design to motor design. Phase angles 48 will also vary according to the amount of voltage applied to the starter motor 12 or the level of RPMs the starter motor is run. Therefore, according to one embodiment of the present invention, an optimal range of phase angles is determined for a particular model of starter motor 12 for a given RPM or voltage level. The starter motor 12 is then tested to determine whether the phase angle 48 associated with a particular starter motor 12 is within the acceptable limits for the phase angle 48 for a given RPM or voltage level.

In some embodiments of the present invention, the starter tester 10 may include a waveform display connected to the processor for displaying waveforms associated with the starter volts and starter current. The waveform display may allow a technician operating the starter tester device 10 to visually see the phase angle 48 and make a determination whether or not the starter motor 12 is operating properly or not. In embodiments of the invention that include a computer 46 the waveform display may include a monitor 58 as shown in FIG. 4.

According to other embodiments of the present invention, the processor 40 determines a value associated with the phase angle 48. A technician operating the starter tester apparatus 10 is able to determine from the value determined by the processor 40 whether the starter motor 12 is acceptable or not. In some embodiments of the invention, the monitor 62 (FIG. 5) may display the value corresponding to the phase angle 48.

In other embodiments according to the present invention, the digital processor 40 may be programmable or part of a programmable computer 46 and permit a technician to enter in what type of starter motor is 12 being tested. The processor 40 or computer 46 may have access to information such as, for example, acceptable parameters for starter motors of the same type. The processor 40 or computer 46 may be configured to compare the tested starter motor 12 to determine if the tested starter motor 12 is operating within acceptable parameters. Thus, the processor 40 or computer 46 may determine whether or not a starter motor 12 is properly functioning when subject to a given amount of voltage or run a certain RPMs. The processor 40 or computer 46 may simply output a signal detectable by a technician operating the starter tester 10 device of whether a starter motor 12 is acceptable or not.

Other embodiments of the invention may include the processor 40 or computer 46 operably connected to a data base providing diagnostic information for a particular starter motor 12. For example, a technician may enter into the starter tester 10, via an imputing device 60, (see FIG. 5) a type of starter motor 12 being tested. Based on the phase angle 48 the motor exhibits at certain RPMs or voltages, the data base can provide not only whether the motor is acceptable or not, but possible problems (i.e., a short, a bad bearing, a broken winding, etc.) causing the starter motor 12 to not be working properly. In addition, the database could provide to a technician what degree or level the starter motor 12 is performing. For example, the starter motor could be characterized as operating normally, or some degree below normal operation.

The database may be integrated with the processor 40 or computer 46 or be remote from the testing apparatus 10 but accessible by the tester 10. Examples of accessibility may include remote access via the internet and/or other types of remote access known in the art.

According to some embodiments of the present invention a method for testing a starter motor is provided. FIG. 3 is a flowchart showing steps for performing a method according to some embodiments of the present invention. The first step 62 involves applying a voltage to an electric motor. The voltage is applied in pulses. The next step 64 includes detecting a current associated with the electric motor. The third step 66 includes comparing the phase angle between the voltage and the current associated with the electric motor. The fourth step 68 includes determining, based on the phase angle, whether the motor is acceptable or not.

In some embodiments of the present invention other determinations may be made regarding the starter motor 12 based on the phase angle 48. For example, the if the phase angle 48 is too short it may be determined that the starter motor 12 has a short in it. If the phase angle 48 is outside an acceptable range it may be determined that the motor 12 has a bad bearing or some other problem causing the motor 12 to have an abnormally high amount of impedance.

According to some embodiments of the present invention the DC generator 14 provides voltage to the starter motor 12 at line voltage (i.e., 60 Hz). In other embodiments of the present invention the DC supply 14 provides voltage to the starter motor 12 at higher frequencies. For example, it may provide voltage to the starter motor 12 along the order of 200 Hz, 100 Khz or greater. Preferably, the DC supply provides voltage to the starter motor 12 at greater than 60 Hz. However, some embodiments of the present invention will provide voltage to the starter motor at 60 Hz or below.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An apparatus for testing an electric motor comprising:
    a voltage generator operatively connected to the motor to pulse a voltage into the motor;
    a current sensor configured to sense a current associated with the motor;
    a detector configured to detect a phase angle between the voltage applied to the motor and current associated with the motor;
    a first differential amplifier;
    a second differential amplifier; and
    a signal processor configured to receive a first signal associated with the pulsed voltage from the first differential amplifier and a second signal associated with the current in the motor from the second differential amplifier,
    wherein the signal processor is configured to output a signal corresponding to the phase angle and the apparatus is attached to a starter motor of an internal combustion engine.

2. The apparatus of claim 1, wherein the detector includes a display configured to display a waveform associated with the voltage pulse and a waveform associated with the current associated with the motor.

3. The apparatus of claim 1, wherein the signal processor is a digital signal processor.

4. The apparatus of claim 1, further comprising an analog to digital converter configured to convert the first and second signals from analog to digital before the first and second signals are received by the signal processor.

5. The apparatus of claim 1, wherein the signal processor is configured to control a voltage output of the voltage generator.

6. The apparatus of claim 1, wherein the voltage pulsed to the motor has a frequency greater than 60 Hz.

7. The apparatus of claim 1, wherein at least one of the voltage generator, current sensor, and detector are part of a computer configured by at least one of hardware or software to test the electric motor.

8. The apparatus of claim 7, wherein the computer is configured to access data regarding specific motors and provide diagnostic information based on the voltage and current applied to the motor.

9. An apparatus for testing an electric motor comprising:
    means for generating a voltage operatively connected to the motor to pulse a voltage into the motor;
    means for sensing a current configured to sense a current associated with the motor;
    means for detecting configured to detect a phase angle between the voltage applied to the motor and current associated with the motor;
    first means for generating a first signal associated with the pulsed voltage;
    second means for generating a second signal associated with the current; and
    means for signal processing configured to receive the first signal associated with the pulsed voltage from the first amplifying means and the second signal associated with the current in the motor from the second amplifying means, wherein the signal processing means is configured to send a signal corresponding to the phase angle and the apparatus is attached to a starter motor of an internal combustion engine.

10. The apparatus of claim 9, wherein the detecting means includes means for displaying a waveform associated with the voltage pulse and configured to display a waveform associated with the current associated with the motor.

11. The apparatus of claim 9, wherein the signal processing means is a digital signal processor.

12. The apparatus of claim 9, further comprising means for converting an analog signal to a digital signal configured to convert the first and second signals from analog to digital before the first and second signals are received by the signal processing means.

13. The apparatus of claim 9, wherein the signal processing means is configured to control a voltage output of the voltage generating means.

14. The apparatus of claim 9, wherein the voltage pulsed to the motor has a frequency greater than 60 Hz.

15. The apparatus of claim 9, wherein the voltage pulsed to the motor has a frequency greater than 200 Hz.

16. A method of testing an electric motor comprising the steps of:

applying a voltage pulse to the motor wherein the motor comprises a starter motor of an internal combustion engine;

detecting a current associated with the motor;

detecting a phase angle between the voltage applied to the motor and current associated with the motor;

providing a first differential amplifier and a second differential amplifier;

configuring a signal processor to receive a first signal associated with a pulsed voltage from the first differential amplifier and a second differential amplifier;

configuring the signal processor to output a signal corresponding to the phase angle; and comparing the phase angle between the voltage and the current.

17. The method of claim 16, further comprising comparing the phase angle between the voltage and current against known phase angles for similar electric motors and determining whether the electric motor is acceptable or not.

18. The method of claim 16, further comprising displaying at least one waveform associated with at least one of the current and voltage.

19. The method of claim 16, further comprising comparing the phase angle against known phase angels for similar electric motors, and providing diagnostic information for the electric motor.

* * * * *